United States Patent
Buthke et al.

(10) Patent No.: US 12,206,402 B2
(45) Date of Patent: Jan. 21, 2025

(54) CONTROL UNIT FOR AN ELECTRICAL LOAD, IN PARTICULAR FOR A MOTOR VEHICLE

(71) Applicant: Hella GmbH & Co. KGaA, Lippstadt (DE)

(72) Inventors: Jan Frederik Buthke, Lippstadt (DE); Jan Schmaeling, Muenden (DE); Martin Strauch, Brilon (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 51 days.

(21) Appl. No.: 18/061,751

(22) Filed: Dec. 5, 2022

(65) Prior Publication Data
US 2023/0095450 A1    Mar. 30, 2023

Related U.S. Application Data

(63) Continuation of application No. PCT/EP2021/063884, filed on May 25, 2021.

(30) Foreign Application Priority Data

Jun. 3, 2020  (DE) .................. 10 2020 114 698.1

(51) Int. Cl.
*H03K 17/687*     (2006.01)
(52) U.S. Cl.
CPC ................ *H03K 17/6877* (2013.01)
(58) Field of Classification Search
CPC ................ H03K 17/6877; H03K 17/0822
USPC ................ 327/379–382
See application file for complete search history.

(56) References Cited

U.S. PATENT DOCUMENTS

| | | | |
|---|---|---|---|
| 4,691,129 A * | 9/1987 | Einzinger | H03K 17/687 327/434 |
| 5,517,379 A | 5/1996 | Williams et al. | |
| 7,889,477 B2 * | 2/2011 | Neubarth | H02M 3/3384 361/212 |
| 11,579,645 B2 * | 2/2023 | Richmond | H03K 17/74 |
| 2011/0188164 A1 * | 8/2011 | Desrochers | H02J 7/0031 361/92 |

* cited by examiner

*Primary Examiner* — Ryan Johnson
*Assistant Examiner* — Colleen J O Toole
(74) *Attorney, Agent, or Firm* — Husch Blackwell LLP

(57) ABSTRACT

A control unit has an input with a positive and negative connectors. The control unit also includes an output and with an electronic switch. The switch has a first connector, a second connector and a control connector, and has an on-state resistance between its first and second connector that depends on a control voltage at the control connector of the switch. The first connector is connected to the connector for the positive potential of the input, the second connector is connected to the connector for the positive potential of the output, and the control connector is connected to a trigger circuit. A second controllable switch is also included with a first connector connected to the second connector of the first switch, a second connector connected to the control connector of the first switch, and a control connector connected to the connector for the negative potential of the input.

8 Claims, 2 Drawing Sheets

CONTROL UNIT FOR AN ELECTRICAL LOAD, IN PARTICULAR FOR A MOTOR VEHICLE

CROSS REFERENCE

This application claims priority to and is a continuation of PCT Application No. PCT/EP/2021/063884, filed May 25, 2021, which itself claims priority to German Application No. 10 2020 114698.1, filed Jun. 6, 2020, the entireties of both of which are hereby incorporated by reference.

FIELD OF THE INVENTION

A control unit for an electrical load is provided, in particular a motor vehicle control unit, with an input for connecting to a voltage source, where the input features a connector for a positive potential of a supply voltage provided by the voltage source and a connector for a negative potential of the supply voltage, with an output, where the output features at least one connector for connecting a positive potential to an electrical load, with an electronic switch, where the switch has a first connector, a second connector and a control connector and where the switch has an on-state resistance between its first and its second connector that depends on a control voltage at the control connector of the switch, where the first connector of the switch is connected to the connector for the positive potential of the input, where the second connector of the switch is connected to the connector for the positive potential of the output and where the control connector is connected to a trigger circuit.

BACKGROUND OF THE INVENTION

Such a control unit can be used in a motor vehicle, for example, to supply a low-impedance load with electrical energy from a 12 V vehicle electrical system.

When connecting the control unit as part of installing the control unit, a situation may arise where the connector of the input for the positive potential is connected to the vehicle electrical system and the connector of the output for the positive potential of the output is connected to the vehicle electrical system or the load but not the connector for the negative potential of the input to the negative potential of the vehicle electrical system, the chassis ground. This might be the case, for example, when the connectors of the input are plugged in one after the other, for example, when the connectors of the input are connected via two different plug connectors or one plug connection is intended for both connectors, but the ground connector is made via a subsequent plug contact. What is known as a ground loss may also occur when operating the motor vehicle, in which the connector for the negative potential of the input loses the connection with the negative potential of the vehicle electrical system. Then the control unit is connected to the negative potential of the vehicle electrical system via its connector for the positive potential of its output and the load.

In the event of the connector of the input for the negative potential not being connected while the connector of the input is connected to the positive potential and the load may, for example, lead to an increase in the potential at the control connector of the first switch due to charging processes in capacitors of the control unit or other effects such as transverse currents. The increase in the potential may lead to a situation where a voltage between the control connector and the second connector of the first switch rising to a level where the first switch for switching on or closing the contact is triggered and conducts a current from the connector for the positive potential of the input to the connector for the positive potential of the output. In doing so, a situation may arise where the voltage between the control connector and the second connector of the first switch rises to a level where a current flows between the first connector and the second connector of the switch but the voltage is not sufficient to completely open the switch so that the on-state resistance of the switch has not reached its minimum level. The current through the switch and its on-state resistance then generates heat in the switch that causes the switch to warm up. Such warming may cause thermal destruction. With a MOSFET as the switch, it is possible, for example, for the maximum tolerable junction temperature to be exceeded, which will cause the switch to be destroyed. Such a failure of the first switch due to a missing connection between the control unit and the negative potential of the vehicle electrical system should be prevented.

BRIEF SUMMARY OF THE INVENTION

The present invention is based on the task of preventing the first switch of the control unit from being damaged or destroyed when the connection to the negative potential of the vehicle electrical system is missing.

In accordance with the invention, this task is solved by the control unit featuring a second controllable switch that has a first connector, a second connector and a control connector; where the first connector of the second switch is connected to the second connector of the first switch; where the second connector of the second switch is connected to the control connector of the first switch and where the control connector of the second switch is connected to the connector for the negative potential of the input.

With the second switch, it is possible to short circuit the connection within the first switch between its control connector and its second connector outside the first switch, so that no voltage is built up between the control connector and the second connector of the first switch that directs a current between the first and the second connectors of the first switch. In this respect, the second switch is integrated into the circuitry of the control unit in such a way that its control connector is connected to the connector for the negative potential of the input. As long as this connector of the input is connected to the negative potential of the vehicle electrical system, there is no potential at the control connector of the second switch that would be sufficient to close the second switch. The second switch then does not have any influence on the functioning of the first switch. If, in contrast, the connector of the input for the negative potential is not connected with the negative potential and if there is an increase in the potential at the connector for the negative potential at the input of the control unit described at the beginning of this document, such increase in the potential will have an effect on the switching state of the second switch, as the potential at the control connector of the second switch is likewise raised. This closes the second switch and the connection between the control connector and the second connector of the first switch are short circuited. Closing of the first switch is thus prevented; it remains open. As the first switch remains open, thermal overload is also prevented that might cause damage to or destruction of the first switch.

A diode can be inserted between the second connector of the first switch and the first switch of the second switch, the anode of which diode is connected to the first connector of the second switch.

The first switch can be a MOSFET, specifically a power MOSFET and the first connector of the first switch can be the drain and the second connector of the first switch can be the source of the MOSFET. The MOSFET can be a normal blocking N-channel MOSFET. It is also possible to use other semiconductor switches or controllable converter valves.

The second switch can be a bipolar transistor and the first connector of the second switch can be the emitter and the second connector of the second switch can be the collector. The bipolar transistor can be an NPN transistor. It is also possible to use other semiconductor switches or controllable converter valves.

If, with the inventive control unit, reversal of the polarity of the input arises instead of a ground loss on account of a missing connection between the connector of the input for the negative potential and the negative potential of the vehicle electrical system, i.e. connection of the connector for the positive potential of the input with the negative potential of the vehicle electrical system and a connection between the connector for the positive potential of the input and the negative potential of the vehicle electrical system, this will lead to current flowing via an inverted diode of the first switch, in particular if this is a MOSFET. Due to the voltage loss of the inverted diode that can amount to around 1 V, the inverted diode generates heat that can likewise lead to damage to or destruction of the first switch.

In order to prevent damage or destruction in the event of reversal of the polarity, the invention provides for the possibility of providing for a third switch with a first connector, a second connector and a control connector with one control unit, where the first connector of the third switch is connected to the connector for the negative potential of the input, where the second connector of the third switch is connected to the control connector of the second switch and where the control connector of the third switch is connected to the connector for the positive potential of the input.

The connection between the connector for the negative potential of the input and the control connector of the second switch can be interrupted or created by the third switch. As the control connector of the third switch is connected to the connector for the positive potential of the input, the third switch will be closed in the case where the connector for the positive potential of the input is connected to the positive potential of the vehicle electrical system. The potential that is present at the negative connector of the input is then transmitted to the control connector of the second switch via the third switch. If the connection between the connector for the negative potential of the input is connected to the negative potential of the vehicle electrical system, the second switch will be open. In the event of a ground loss, in contrast, the potential at the connector for the negative potential and thus also at the control connector of the second switch is increased and the second switch is closed and the control connector of the first switch and the second connector of the first switch are connected to each other, which prevents current from flowing via the first switch.

The third switch can also be a MOSFET. The first connector of the third switch can be the drain and the second connector of the first switch can be the source of the MOSFET. The MOSFET can be a normal blocking N-channel MOSFET.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION OF THE DRAWINGS

Figure 1:
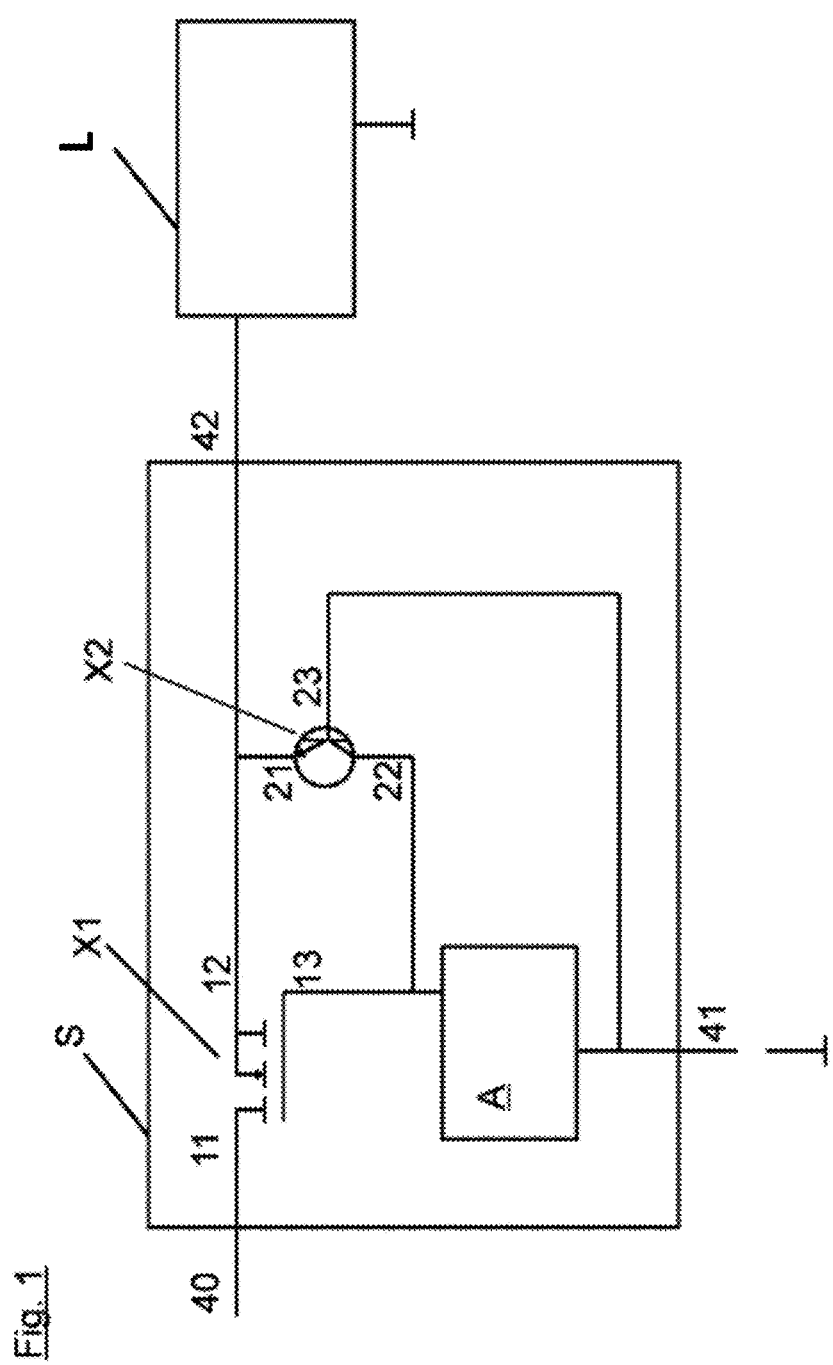
FIG. 1 is a first schematic wiring diagram of a control unit.

The control unit S in accordance with FIG. 1 features an input for connecting to a motor vehicle electrical system and an output for connecting to a load L. The load L can be a low-impedance load, such as a heat source, in particular a rear-window heater.

The input has a connector 40 for connecting to the positive potential of the vehicle electrical system and a connector 41, the ground connector for connecting to the negative potential of the vehicle electrical system, that forms the reference potential of the circuitry.

The output has an output with a connector 42 that is connected to the load L. In addition, the load L has a ground connector that is connected to the negative potential of the vehicle electrical system.

A performance path extends between the connector 40 for the positive potential and the connector 42 of the output. A first electronic switch X1, a normal blocking N-channel power MOSFET is provided for in the performance path. This first switch X1 has a first connector 11, the drain, that is connected to the connector 40, a second connector 12, the source, that is connected to the connector 42 and a control connector, the gate, 13, that is connected to a trigger circuit A of the control unit, the details of which are not shown. The trigger circuit is connected among other things to the connector 41 of the input.

The switch X1 can be triggered for closing and opening by means of the trigger circuit A.

A second electronic switch X2, a NPN bipolar transistor is arranged between the second connector 12 of the first switch X1 and the control connector 13 of the first switch. This has a first connector 21, the emitter, that is connected to the second connector 12 of the first switch X1, a second connector 22, the collector, that is connected to the control connector 13 of the first switch X1 and a control connector 23, that is connected to the connector 41 of the input.

The control unit S is intended to switch the load connected to the control unit S on and off, for which purpose the required control signals are generated in the trigger circuit A of the control unit S that are present at the control connector 13 of the first switch.

If the control unit S is connected to the load L and the ground connector of the load is connected with the negative potential of the vehicle electrical system, a case may arise where the control unit with the connector 40 for the positive potential is connected to positive potential of the vehicle electrical system but the connector 41 for the negative potential is not connected at the same time or previously to the negative potential of the vehicle electrical system. In this case, the control unit S is only connected to the negative potential of the vehicle electrical system via the load L. In this case, an increase in the potential at 41 can arise via the negative potential of the vehicle electrical system, in particular through charging processes of capacitors in the control unit S. With the control unit in accordance with FIG. 1, this leads to the second switch X2, the control connector 23 of which is connected to connector 41, being closed. This brings the second connector 12 and the control connector 13 of the first switch to a potential, which prevents the closing of the first switch X1. A current flow that leads to overheating of the first switch X1 with a solution in accordance with the state of technology is prevented with the control unit in accordance with FIG. 1.

One disadvantage of the control unit depicted in FIG. 1 is that, in the event of reversal of the polarity of a vehicle electrical system source, the positive potential of the vehicle electric system voltage will be incorrectly present at the ground connector of the load L and the negative potential will be incorrectly present at connector 40 of the input of the control unit S. This leads to a situation where a voltage falls from the second connector 12 to the first connector 11 of the first switch X1 that drives a current via an inverted diode or body diode of the first switch that is a power MOSFET. Due to the fall in voltage over the inverted diode, this current can lead to the generation of heat that causes the temperature of the first switch X1 to rise so sharply that the first switch X1 is damaged or destroyed. The second switch is closed by the second switch X2 at the control connector 23 of which the positive potential of the vehicle electrical system voltage is present in the event of polarity being reversed. This means that the control connector 13 and the second connector 12 of the first switch X1 are on the same potential, which prevents the closing of the first switch. Closing of the first switch X1 would, however, have the advantage that the current would not be conducted via the inverted diode but via the completely opened N-channel of the MOSFET, which causes the development of significantly less heat in the first switch X1, so little heat that the first switch X1 does not suffer any damage.

Figure 2:
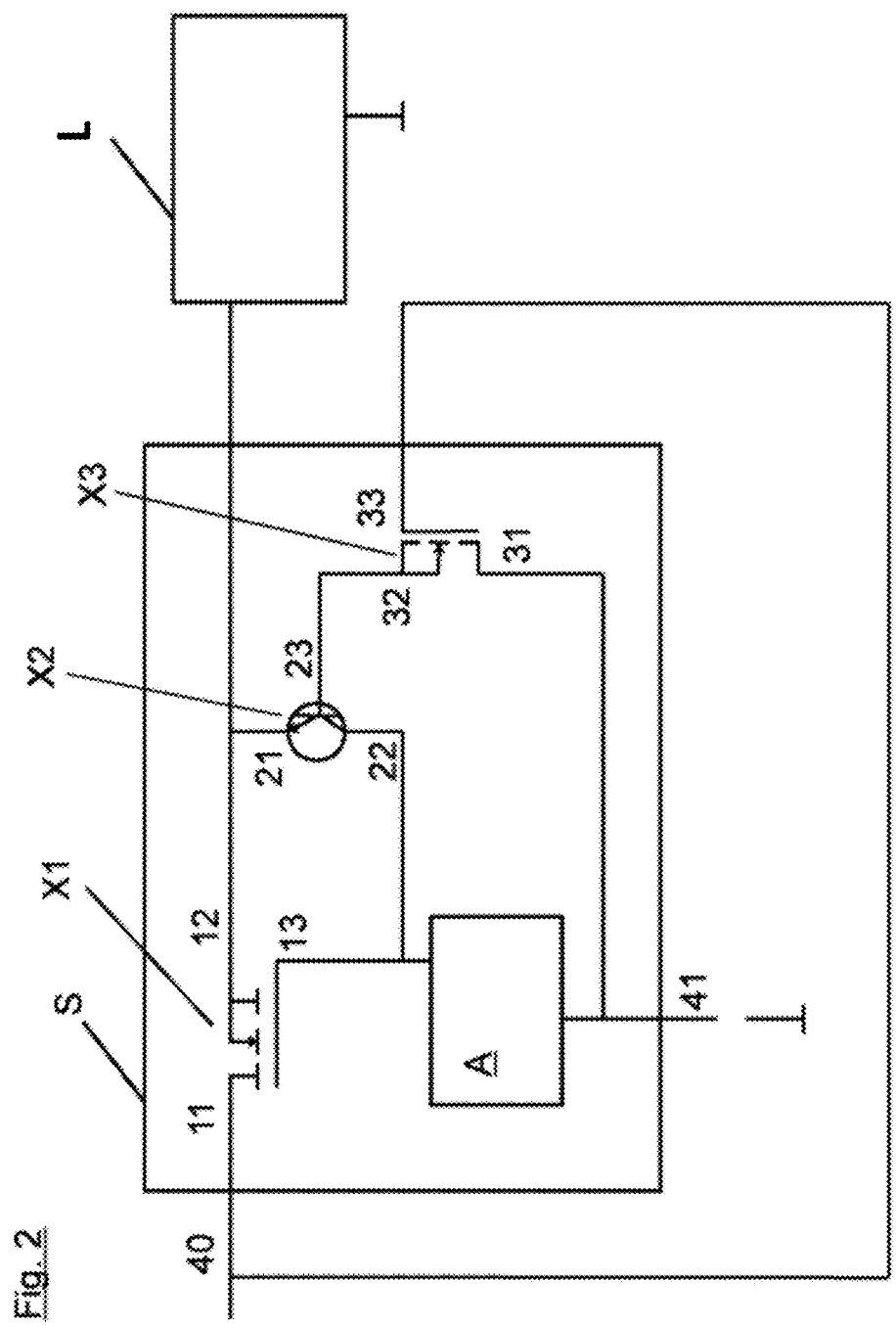
FIG. 2 is a second schematic wiring diagram of a control unit.

The control unit in accordance with the wiring diagram from FIG. 2 corresponds to a great extent the control unit from FIG. 1. The control unit from FIG. 2 additionally features, however, a third switch X3, which is a normal blocking N-channel MOSFET. This third switch X3 has a first connector 31 that is connected to the connector 41 for the negative potential of the vehicle electrical system voltage, a second connector 32, that is connected to connector 23 of the second switch X2 and a control connector 33 that is connected to the connector 40 for the positive potential vehicle electrical system voltage.

If there is no reversal of polarity but connector 41 for the negative potential of the input of the control unit is not connected to the negative potential, the positive potential of the vehicle electrical system voltage will be present at the control connector 33 of the third switch X3. This causes the third switch X3 to be closed. The potential present at the first connector 31 or the connector 41 is then present at the control connector 23 of the second switch X2, which is closed for this reason. In this way, the control connector 13 and the second connector 12 of the first switch are connected, for which reason the first switch X1 blocks completely. No current flows over the first switch X1, which in this case is protected from overheating.

If, in contrast, the polarity of the voltage in the vehicle electrical system is reversed, the negative potential of the vehicle electrical system voltage will be present at connector 40 of the input and thus at the control connector 33 of the third switch X3. This causes the third switch X3 to be open. As a consequence, also the second switch X2, the control connector 23 of which is connected to the second connector 32 of the third switch is likewise open. The control connector 13 and the second connector 12 of the first switch X1 are then not connected to each other. A high potential is then present at the control connector 13 of the first switch X1 in comparison to the second connector 12 of the switch X1. The voltage between the control connector 13 and the second connector 12 is above the threshold voltage of the MOSFET, which causes the first switch X1 to close completely and to be able to conduct a current from the second connector to the first connector that does not cause damage to or destruction of the first switch X1.

LIST OF REFERENCE NUMBERS

S Control unit
X1 First electronic switch
11 First connector of X1
12 Second connector of X1
13 Control connector of X1
X2 Second electronic switch
21 First connector of X2
22 Second connector of X2
23 Control connector of X2
X3 Third electronic switch
31 First connector of X3
32 Second connector of X3
33 Control connector of X3
40 Connector of the input for the positive potential
41 Connector of the input for the negative potential
A Trigger circuit
L Load

The invention claimed is:

1. A control unit(S) for an electrical load, the control unit comprising:
   an input including a connector for a positive potential of a supply voltage provided by the voltage source and a connector for a negative potential of the supply voltage;
   an output including at least one connector for connecting a positive potential to an electrical load (L);
   a first electronic switch with a first connector, a second connector, and a control connector, wherein:
      the first connector of the first switch is connected to the connector for the positive potential of the input;
      the second connector of the first switch is connected to the connector for the positive potential of the output; and
      the control connector of the first switch is connected to a trigger circuit;
   a second electronic switch that has a first connector, a second connector, and a control connector, wherein:
      the first connector of the second switch is connected to the second connector of the first switch;
      the second connector of the second switch is connected to the control connector of the first switch; and
      the control connector of the second switch is connected to the connector for the negative potential of the input; and
   a third electronic switch with a first connector, a second connector, and a control connector, wherein:
      the first connector of the third switch is connected to the connector for the negative potential of the input,
      the second connector of the third switch is connected to the control connector of the second switch; and
      the control connector of the third switch is connected to the connector for the positive potential of the input.

2. The control unit in accordance with claim 1, further including a diode inserted between the second connector of the first electronic switch and the first connector of the second electronic switch, the anode of which diode is connected to the first connector of the second electronic switch.

3. The control unit in accordance with claim 1, wherein the first electronic switch is a MOSFET and the first connector of the first electronic switch is a drain and the second connector of the first electronic switch is a source of the MOSFET.

4. The control unit in accordance with claim 3, wherein the MOSFET is a normal blocking N-channel MOSFET.

5. The control unit in accordance with claim 1, wherein the second electronic switch is a bipolar transistor and the first connector of the second electronic switch is an emitter and the second connector of the second electronic switch is a collector.

6. The control unit in accordance with claim 5, wherein the bipolar transistor is an NPN transistor.

7. The control unit in accordance with claim 1, wherein the third electronic switch is a MOSFET and the first connector of the third electronic switch is a drain and the second connector of the third electronic switch is a source of the MOSFET.

8. The control unit in accordance with claim 7, wherein the MOSFET is a normal blocking N-channel MOSFET.

* * * * *